(12) United States Patent
Sung

(10) Patent No.: US 11,456,179 B2
(45) Date of Patent: Sep. 27, 2022

(54) METHODS FOR FORMING SEMICONDUCTOR DEVICE HAVING UNIFORM FIN PITCH

(71) Applicant: Applied Materials, Inc., Santa Clara, CA (US)

(72) Inventor: Min Gyu Sung, Latham, NY (US)

(73) Assignee: Applied Materials, Inc., Santa Clara, CA (US)

(*) Notice: Subject to any disclaimer, the term of this patent is extended or adjusted under 35 U.S.C. 154(b) by 126 days.

(21) Appl. No.: 16/928,267

(22) Filed: Jul. 14, 2020

(65) Prior Publication Data
US 2022/0020593 A1   Jan. 20, 2022

(51) Int. Cl.
*H01L 21/3065* (2006.01)
*H01L 21/8234* (2006.01)
*H01L 21/308* (2006.01)

(52) U.S. Cl.
CPC ...... *H01L 21/3065* (2013.01); *H01L 21/3081* (2013.01); *H01L 21/823431* (2013.01)

(58) Field of Classification Search
None
See application file for complete search history.

(56) References Cited

U.S. PATENT DOCUMENTS

| 7,902,035 B2* | 3/2011 | Yu | H01L 29/7851 438/424 |
| 8,941,153 B2* | 1/2015 | Lee | H01L 27/0886 257/288 |
| 2011/0177661 A1* | 7/2011 | Song | H01L 27/11521 257/E21.422 |

* cited by examiner

*Primary Examiner* — Stephanie P Duclair
(74) *Attorney, Agent, or Firm* — KDB Firm PLLC

(57) ABSTRACT

Disclosed are approaches for forming a semiconductor device. In some embodiments, a method may include providing a patterned hardmask over a substrate, and providing, from an ion source, a plasma treatment to a first section of the patterned hardmask, wherein a second section of the patterned hardmask does not receive the plasma treatment. The method may further include etching the substrate to form a plurality of fins in the substrate, wherein the first section of the patterned hardmask is etched faster than the second section of the patterned hardmask.

17 Claims, 5 Drawing Sheets

METHODS FOR FORMING SEMICONDUCTOR DEVICE HAVING UNIFORM FIN PITCH

FIELD OF THE DISCLOSURE

The present disclosure relates to semiconductor devices, and more particularly, to devices and fin cut methods for forming semiconductor devices having uniform fin pitch.

BACKGROUND OF THE DISCLOSURE

Generally, in the fabrication of IC devices, lithography processes may be utilized to print/pattern cavities, trenches, recessed-areas, and other elements for creating various components and circuits. Various process operations, such as etching, may then be performed on the underlying layer of material or substrate through patterned block or cut masks. However, with advancements in processes utilized to manufacture IC devices, as well as industry demand for more efficient and smaller sized devices, physical dimensions of the elements as well as their proximity to each other are reduced. As a result, spaces (a pitch) between adjacent elements may be reduced causing a reduction in error tolerance/thresholds in various fabrication processes.

For a highly scaled fin pitch (e.g., less than 30 nm), fins may be cut on the hardmask level to prevent fin spike generation. Unfortunately, hardmask level fin cut processes lead to profile variation in the cut area, which is caused by pattern loading effect during dry etching. This fin profile variation in turn can cause device variation, which impacts product yield and degrades performance.

It is with respect to these and other deficiencies of the prior art that the present disclosure is provided.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach, a method may include providing a patterned hardmask over a substrate, and providing, from an ion source, a plasma treatment to a first section of the patterned hardmask, wherein a second section of the patterned hardmask does not receive the plasma treatment. The method may further include etching the substrate to form a plurality of fins in the substrate, wherein the first section of the patterned hardmask is etched faster than the second section of the patterned hardmask.

In another approach, a method of forming a semiconductor device may include providing a patterned hardmask over a substrate, the patterned hardmask including a first section and a second section, and providing a mask over the second section of the patterned hardmask. The method may further include providing a plasma treatment through an opening of the mask, wherein the plasma treatment impacts the first section of the patterned hardmask without impacting the second section of the patterned hardmask, and performing an etch process to the substrate to form a plurality of fins in the substrate, wherein the first section of the patterned hardmask is etched faster than the second section of the patterned hardmask.

In another approach, a fin cut method may include providing a patterned hardmask over a substrate, the patterned hardmask including a first section and a second section, and providing a mask over the second section of the patterned hardmask. The method may further include performing a plasma treatment through an opening of the mask, wherein the plasma treatment impacts the first section of the patterned hardmask, and performing an etch process to the substrate to form a first set of fins and a second set of fins, wherein the first section of the patterned hardmask and the first set of fins are etched faster than the second section of the patterned hardmask and the second set of fins.

BRIEF DESCRIPTION OF THE DRAWINGS

By way of example, embodiments of the disclosure will now be described, with reference to the accompanying drawings, in which.

Figure 1:
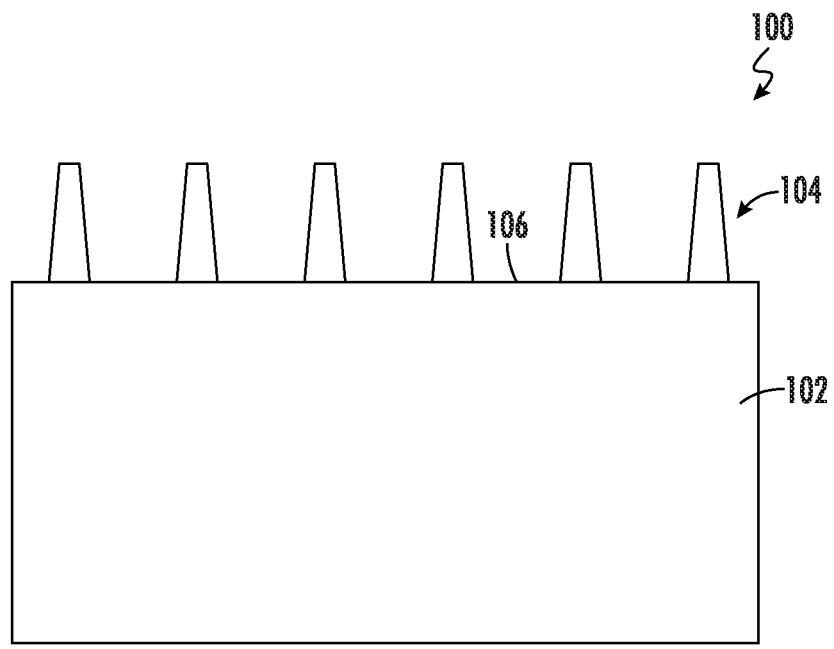
FIG. 1 is a side cross-sectional view of a device including a substrate and patterned hardmask according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and semiconductor devices in accordance with the present disclosure will now be described more fully hereinafter with reference to the accompanying drawings, where embodiments of the methods are shown. The methods and semiconductor devices may be embodied in many different forms and are not to be construed as being limited to the embodiments set forth herein. Instead, these embodiments are provided so the disclosure will be thorough and complete, and will fully convey the scope of the system and method to those skilled in the art.

FIG. 1 depicts a side cross-sectional view of a semiconductor device (hereinafter "device") 100 in accordance with embodiments of the present disclosure. The device 100 may include a substrate 102 and a patterned hardmask 104 atop an upper surface 106 of the substrate 102. As shown, the patterned hardmask 104 may include a set of trenches between a set of patterning features. Although non-limiting, the patterned hardmask 104 may be a SiN formed by a SADP process or a SAQP process.

In some embodiments, the substrate 102 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 102 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 102, the substrate 102 may include a buried dielectric layer disposed on a crystalline silicon substrate. In the embodiment depicted herein, the substrate 102 may be a crystalline silicon substrate. Moreover, the substrate 102 is not limited to any particular size or shape. The substrate 102 may be a round substrate having a 200 mm diameter, a 300 mm diameter or other diameters, such as 450 mm, among others. The substrate 102 may also be any polygonal, square, rectangular, curved or otherwise non-circular workpiece, such as a polygonal glass substrate used in the fabrication of flat panel displays.

Figure 2:
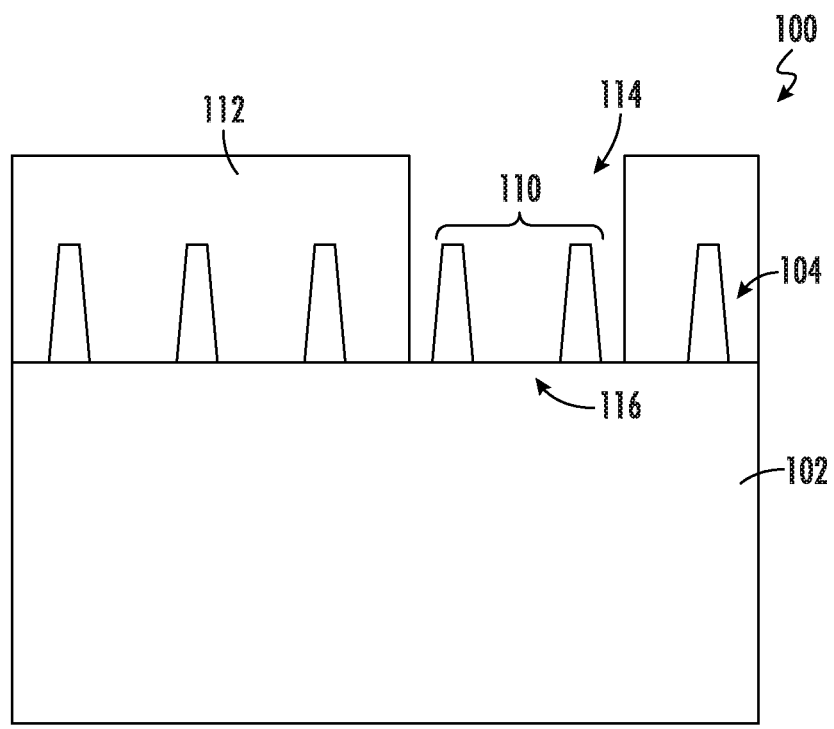
FIG. 2 is a side cross-sectional view of the device with a mask formed over the patterned hardmask according to embodiments of the present disclosure.

FIG. 2 depicts a side cross-sectional view of the device 100 following formation of a mask 112 over the substrate 102. In some embodiments, the mask 112 may be a photoresist conformally deposited over the substrate 102 and the patterned hardmask 104. The mask 112 may then be processed to form an opening 114 therein. As shown, the opening 114 exposes a first section 110 of the patterned hardmask 104. It will be appreciated that the opening 114 may be formed in a fin cut area 116 of the device 100.

Figure 3:
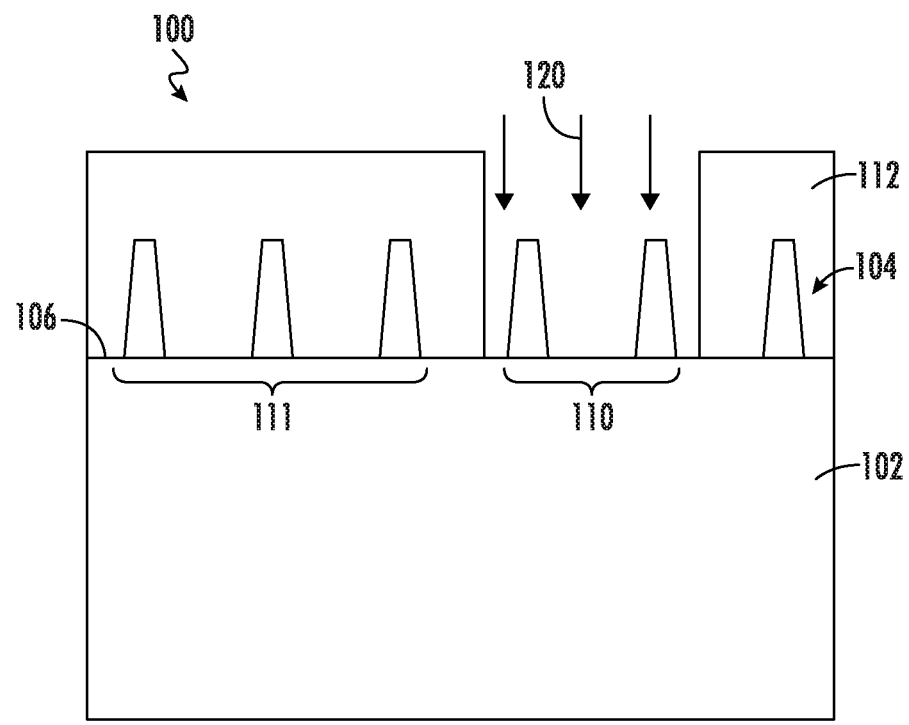
FIG. 3 is a side cross-sectional view of the device during a plasma treatment according to embodiments of the present disclosure.

FIG. 3 depicts a side cross-sectional view of the device 100 during a plasma treatment 120. In some embodiments, the plasma treatment 120 may be an ion assisted directional plasma treatment to treat the first section 110 of the patterned hardmask 104. As shown, the plasma treatment 120 is delivered through the opening 114 of the mask 112. A second section 111 of the patterned hardmask 104, which remains covered by the mask 112, does not receive the plasma treatment 120. The plasma treatment 120 may be delivered vertically as shown (e.g., perpendicular to a plane defined by the upper surface 106 of the substrate 102) or at one or more selected angles of inclination.

The ions of the plasma treatment 120 may modify surface properties of the first section 110 of the patterned hardmask 104. For example, the plasma treatment 120 may increase an etch rate of the first section 110 of the patterned hardmask 104 during a subsequent etch process. It will be appreciated that the degree to which the physical or chemical composition of the first section 110 of the patterned hardmask 104 is modified may be determined by one or more variables, including the species of ion selected, the material properties of the patterned hardmask 104 being modified, the rotational orientation of the substrate 102, the temperature at which the ions are implanted, the concentration and/or dosage of the ion being implanted, and the amount of energy with which the ions are implanted in the patterned hardmask 104.

Figure 4:
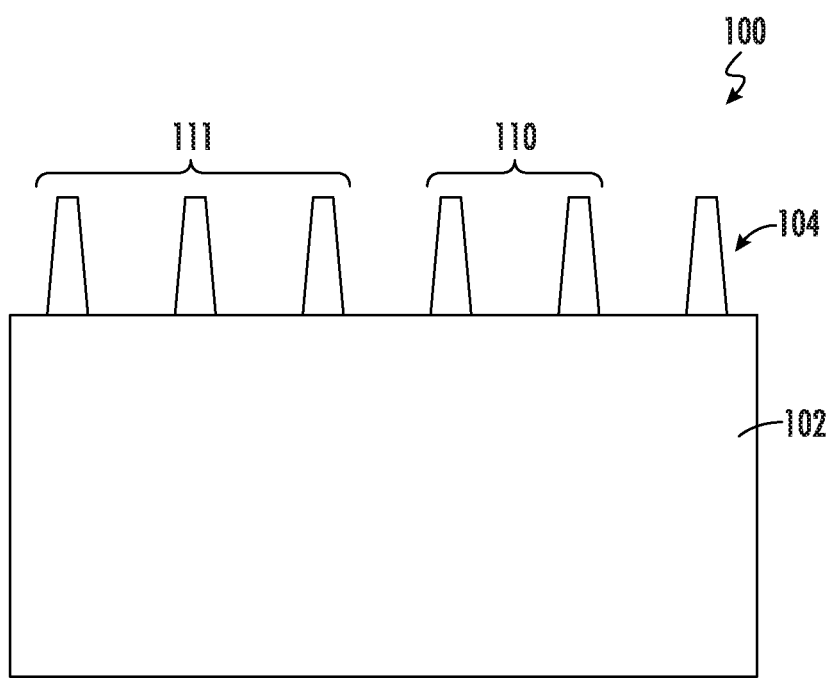
FIG. 4 is a side cross-sectional view of the device following removal of the mask according to embodiments of the present disclosure.
Figure 5:
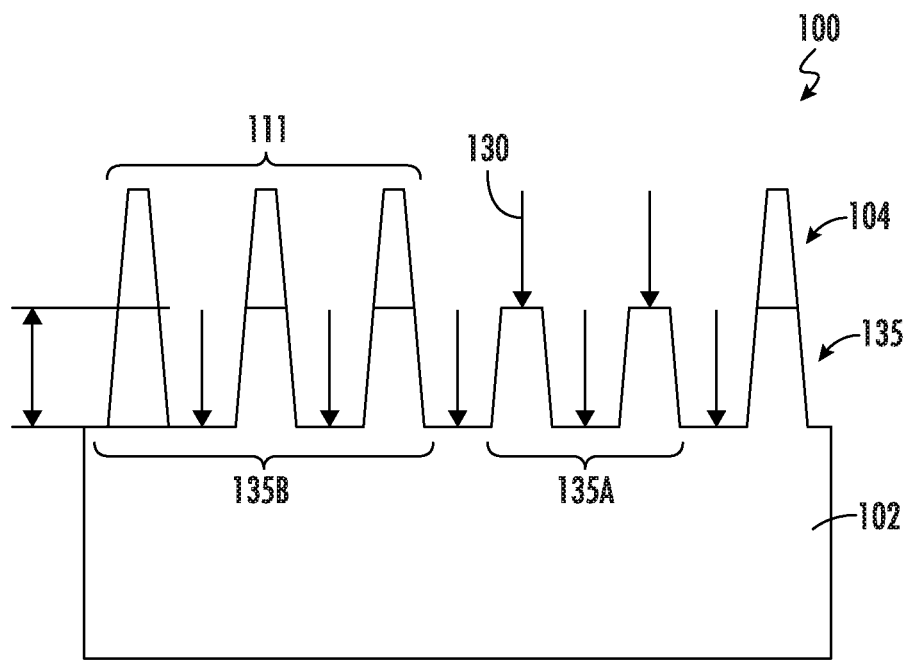
FIGS. 5-7 are a side cross-sectional views of the device during an etch process according to embodiments of the present disclosure.

The mask 112 may then be removed, as demonstrated in FIG. 4, and an etch process 130 may then be started, as shown in FIG. 5. In some embodiments, the etch process 130 may be any suitable etch process, such as a reactive ion etch (RIE), neutral beam etch (NBE), the like, or a combination thereof. The etch may be anisotropic. As shown, the etch process 130 causes a plurality of fins 135 to be formed in the substrate 102. More specifically, the etch process 130 may form a first set of fins 135A generally beneath the first section 110 (not shown) of the patterned hardmask 104 and a second set of fins 135B generally beneath the second section 111 of the patterned hardmask 104. Because the first section 110 of the patterned hardmask 104 is etched faster than the second section 111 of the patterned hardmask 104 (due to the previous plasma treatment 120), the first section 110 of the patterned hardmask 104 will be removed as the plurality of fins 135 is formed. At this stage in the etch process 130, the first and second sets of fins 135A, 135 may generally have a uniform height 'H'.

Figure 6:
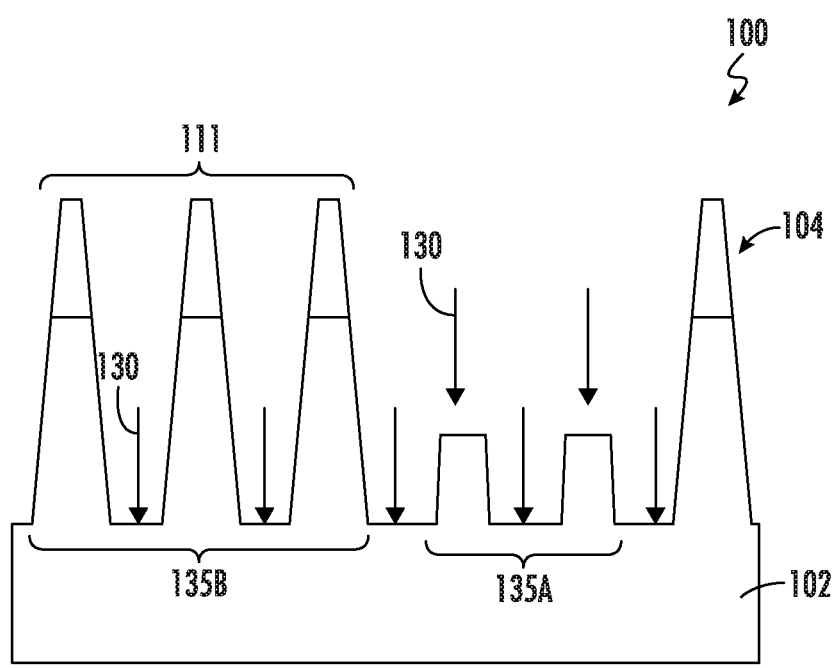
Figure 7:
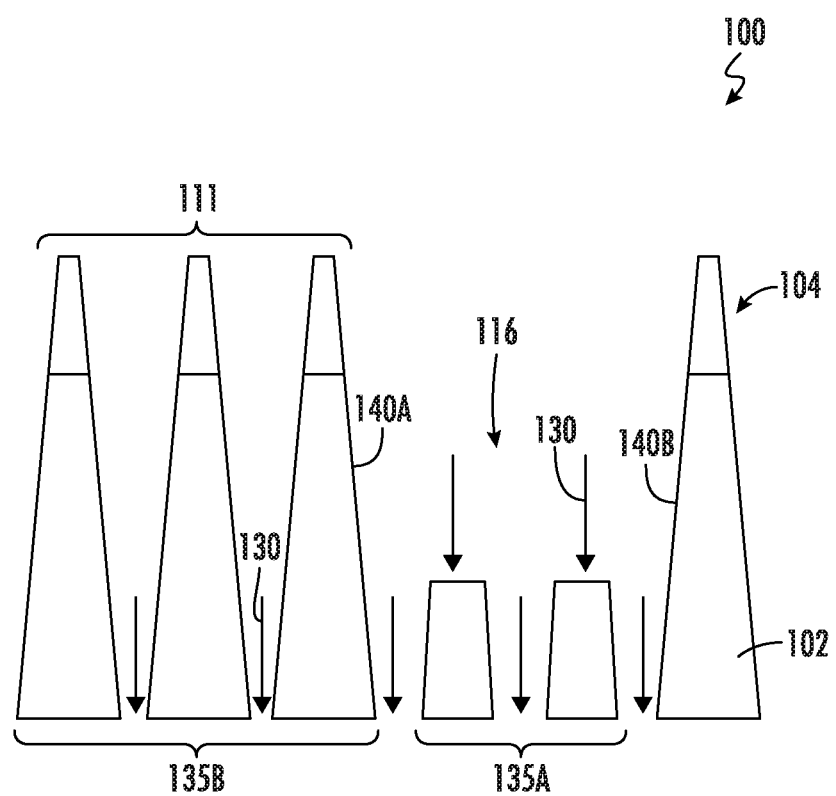

The etch process 130 may continue, as shown in FIGS. 6-7, resulting in the second set of fins 135B having a greater height than the first set of fins 135A. Due to the continued presence of the second section 111 of the patterned hardmask 104, the second set of fins 135B may be less impacted by the etch process 130. Furthermore, during the etch process 130, there is no pattern loading effect as a single pattern pitch is maintained, e.g., along sidewall 140A and sidewall 140B (FIG. 7) on opposite sides of the fin cut area 116.

Figure 8:
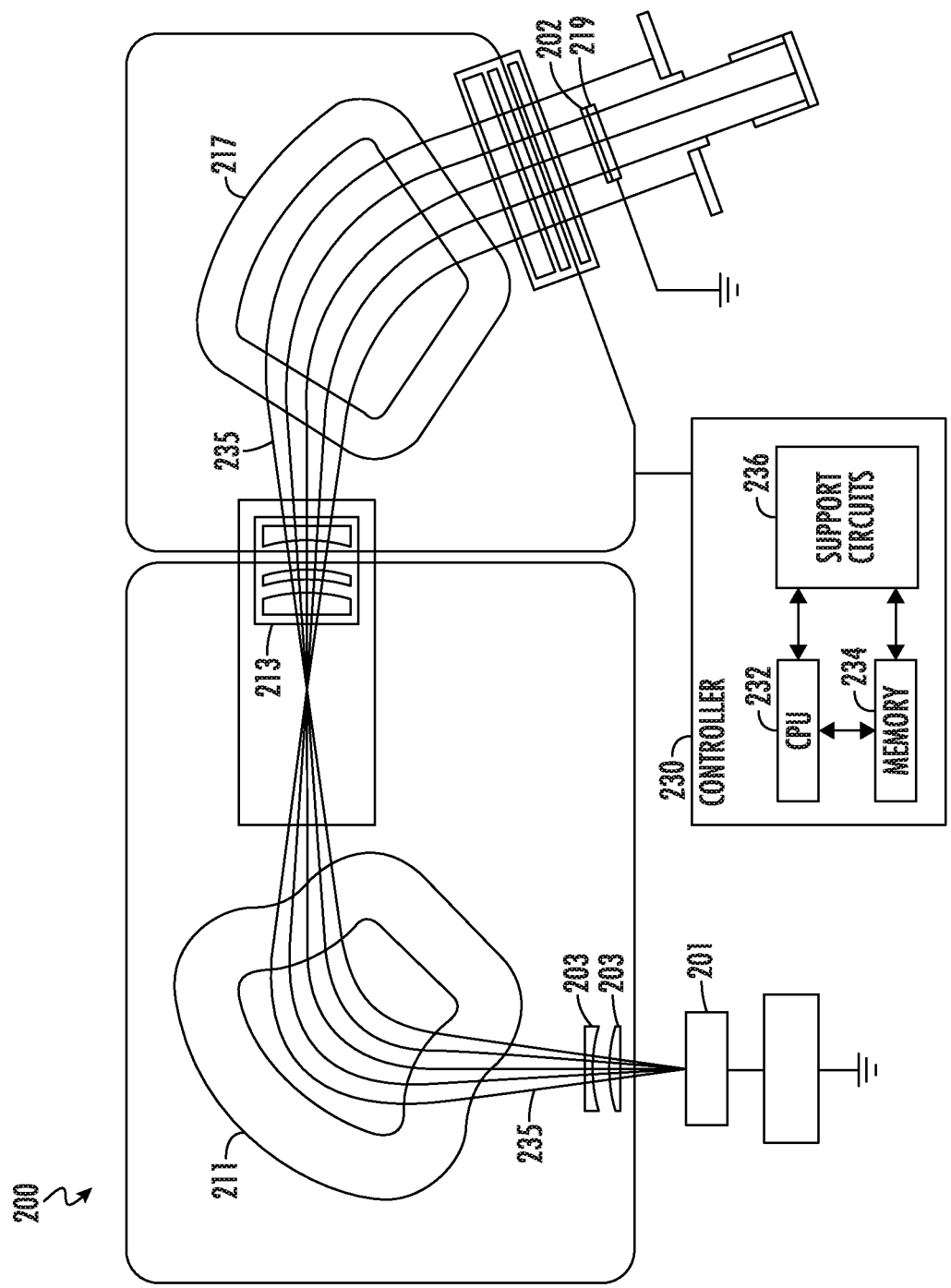
FIG. 8 illustrates a schematic diagram of a processing apparatus according to embodiments of the present disclosure.

FIG. 8 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide a plasma treatment, e.g., an ion assisted directional plasma treatment. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above from which the device 100 is formed. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such a controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 100 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the apparatus 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing a patterned hardmask over a substrate, wherein the patterned hardmask comprises a plurality of alternating trenches and patterning features, and wherein each of the trenches exposes an upper surface of the substrate;
    providing, from an ion source, a plasma treatment to a first section of the patterned hardmask, wherein a second section of the patterned hardmask does not receive the plasma treatment; and
    etching the substrate to form a plurality of fins in the substrate, wherein the first section of the patterned hardmask is etched faster than the second section of the patterned hardmask, and wherein the first section of the patterned hardmask is removed without removing the second section of the patterned hardmask.

2. The method of claim 1, further comprising forming a mask over the second section prior to the plasma treatment.

3. The method of claim 2, wherein the plasma treatment is delivered through an opening of the mask.

4. The method of claim 2, wherein the mask is removed following the plasma treatment.

5. The method of claim 1, further comprising removing the first section of the patterned hardmask.

6. The method of claim 1, wherein etching the substrate comprises:
    forming a first set of fins of the plurality of fins; and
    forming a second set of fins of the plurality of fins adjacent the first set of fins of the plurality of fins, wherein the second section of the patterned hardmask is disposed atop the second set of fins.

7. The method of claim 6, wherein the first set of fins of the plurality of fins is etched to a first fin height, wherein the first fin height is less than a second fin height of the second set of fins of the plurality of fins.

8. The method of claim 1, wherein the plasma treatment is an ion assisted directional plasma treatment.

9. A method of forming a semiconductor device, comprising:
    providing a patterned hardmask over a substrate, wherein the patterned hardmask includes a first section and a second section, wherein the patterned hardmask comprises a plurality of alternating trenches and patterning features, and wherein each of the trenches exposes an upper surface of the substrate;
    providing a mask over the second section of the patterned hardmask;
    providing a plasma treatment through an opening of the mask, wherein the plasma treatment impacts the first section of the patterned hardmask without impacting the second section of the patterned hardmask; and
    performing an etch process to the substrate to form a plurality of fins in the substrate, wherein the first section of the patterned hardmask is etched faster than the second section of the patterned hardmask, and wherein the etch process removes the first section of the patterned hardmask without removing the second section of the patterned hardmask.

10. The method of claim 9, further comprising removing the mask following the plasma treatment.

11. The method of claim 9, wherein the etch process removes the first section of the patterned hardmask.

12. The method of claim 9, wherein etching the substrate comprises:
    forming a first set of fins of the plurality of fins; and
    forming a second set of fins of the plurality of fins adjacent the first set of fins of the plurality of fins, wherein the second section of the patterned hardmask is disposed atop the second set of fins.

13. The method of claim 12, wherein the first set of fins of the plurality of fins is etched to a first fin height, wherein the first fin height is less than a second fin height of the second set of fins of the plurality of fins.

14. A fin cut method, comprising:
    providing a patterned hardmask over a substrate, wherein the patterned hardmask includes a first section and a second section, wherein the patterned hardmask comprises a plurality of alternating trenches and patterning features, and wherein each of the trenches exposes an upper surface of the substrate;
    providing a mask over the second section of the patterned hardmask;
    performing a plasma treatment through an opening of the mask, wherein the plasma treatment impacts the first section of the patterned hardmask; and
    performing an etch process to the substrate to form a first set of fins and a second set of fins, wherein the first section of the patterned hardmask and the first set of fins are etched faster than the second section of the patterned hardmask and the second set of fins, wherein the first set of fins is etched to a first fin height, and wherein the first fin height is less than a second fin height of the second set of fins.

15. The fin cut method of claim 14, further comprising removing the mask following the plasma treatment.

16. The fin cut method of claim 14, wherein the etch process removes the first section of the patterned hardmask without removing the second section of the patterned hardmask.

17. The fin cut method of claim 14, wherein the plasma treatment is an ion assisted directional plasma treatment.

* * * * *